United States Patent [19]

Shinbara

[11] Patent Number: 4,584,542
[45] Date of Patent: Apr. 22, 1986

[54] FREQUENCY MODULATOR HAVING PARALLEL-CONNECTED PHASE ADDER AND OSCILLATOR AMPLIFICATION ELEMENTS

[75] Inventor: Seitaro Shinbara, Yokohama, Japan

[73] Assignee: Tokyo Shibaura Denki Kabushiki Kaisha, Kawasaki, Japan

[21] Appl. No.: 579,457

[22] Filed: Feb. 13, 1984

[30] Foreign Application Priority Data

Feb. 16, 1983 [JP] Japan .................................. 58-24324

[51] Int. Cl.$^4$ .............................................. H03C 3/02
[52] U.S. Cl. .................. 332/16 T; 332/23 R; 455/42; 455/110
[58] Field of Search ................. 332/16 R, 16 T, 23 R, 332/24, 23 A; 455/42, 110, 112, 113

[56] References Cited

U.S. PATENT DOCUMENTS 3,815,052  6/1974  Watatani et al. ............. 332/16 T X

OTHER PUBLICATIONS

Tateshita et al., "IC for RF Modulator in VCR", Toshiba Review, vol. 36, No. 9, pp. 838–842 (Aug. 1981).

Primary Examiner—Siegfried H. Grimm
Attorney, Agent, or Firm—Schwartz, Jeffery, Schwaab, Mack, Blumenthal & Evans

[57] ABSTRACT

A frequency modulator comprises an oscillator circuit, and a phase adder circuit receiving a signal derived by phase-shifting an oscillation output of the oscillator circuit by 90° and multiplying the phase-shifted signal by a modulating signal, and adding the product, thereby varying an oscillation frequency of the oscillator circuit. The frequency modulator is characterized in that the amplification elements of the phase adder circuit and the oscillator circuit are connected in parallel with respect to a power source.

3 Claims, 3 Drawing Figures

FREQUENCY MODULATOR HAVING PARALLEL-CONNECTED PHASE ADDER AND OSCILLATOR AMPLIFICATION ELEMENTS

BACKGROUND OF THE INVENTION

The present invention relates to a frequency modulator.

A prior art frequency modulator has been constructed in a manner such as shown in FIG. 1. As shown, it comprises an oscillator circuit of a multivibrator type.

The circuit comprises a resistor R1 connected at one end to a supply voltage and at its other end to a first side of a tank circuit comprising an inductor L1, a capacitor C1, a resistor R2, a diode D1, and a diode D2, all connected in parallel with one another. The diodes D1 and D2 are connected in a mutually inverted fashion. A second side of the tank circuit is connected to the base of an NPN transistor Q1. The collector of transistor Q1 is connected to the power supply, and the emitter of transistor Q1 is connected to ground through a pair of serially-connected, forward-biased diodes D3, D4 and a resistor R3. The first side of the tank circuit is connected to the base of a second NPN transistor Q2 which is essentially connected in parallel with transistor Q1. Thus, the collector of transistor Q2 is connected to the power supply, and the emitter of transistor Q2 is connected to ground through a pair of forward-biased, serially-connected diodes D5, D6 and a resistor R4.

The first side of the tank circuit is also connected to the collector of a third NPN transistor Q3. The base of transistor Q3 is connected to the junction of diode D4 and resistor R3. The emitter of transistor Q3 is connected to ground through series-connected resistor R5 and constant current source IO1.

The collector of a fourth NPN transistor Q4 is connected to the second side of the tank circuit through series-connected NPN transistor Q5. The base of transistor Q4 is connected to the junction of diode D6 and resistor R4. The emitter of transistor Q4 is connected to ground through a series combination of resistor R6 and constant current supply IO2. The emitter of transistor Q4 is also connected to the emitter of transistor Q3 through a resistor R7.

Transistor Q5 constitutes a phase adder circuit. Applied to the base of the transistor Q5 is a fixed bias from a power source B1. Applied to the emitter of the transistor Q5 is a current signal Vs which is derived by phase-shifting the oscillation output of the oscillator circuit by 90° and multiplying the phase-shifted signal by a modulating signal such as an audio signal.

The frequency modulator constructed as above, however, has the following problems.

(1) Since the transistor Q5 of the phase adder circuit for varying the phase of the oscillation of the oscillator circuit is connected in series with the transistor Q4 of the oscillator circuit, the power source voltage Vcc must be high to ensure proper operation of the transistors Q4, Q5.

(2) Since the signal Vs is given in the form of a current signal (one that is given by a current source), the voltage at the emitter of the transistor Q5 cannot be made low.

SUMMARY OF THE INVENTION

An object of the invention is to provide a frequency modulator with which the voltage level of a power source to be provided for an oscillator circuit can be low.

In accordance with the present invention, a frequency modulator is provided which is characterized in that the amplification element of a phase adder circuit and an amplification element of the oscillator circuit are connected in parallel with respect to a power source.

DETAILED DESCRIPTION OF THE PREFERRED EMBODIMENT

Figure 2:
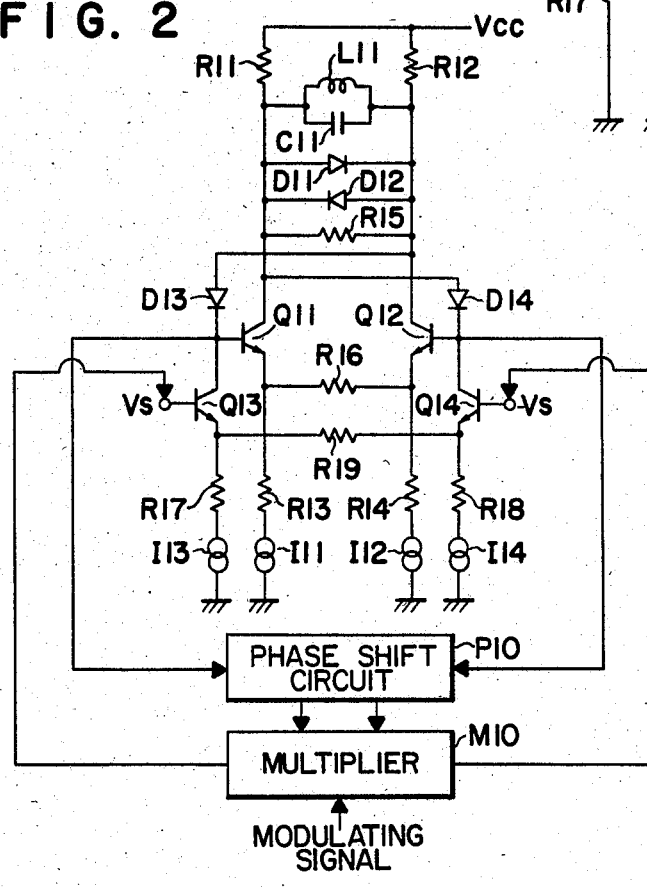
FIG. 2 is a circuit diagram illustrating one embodiment of the frequency modulator according to the present invention.

FIG. 2 shows one embodiment of the present invention.

A frequency modulator of the illustrated embodiment comprises an oscillator circuit which is of a multivibrator type, oscillating at the frequency of 4.5 MHz.

This circuit also comprises a tank circuit comprising an inductor L11, a capacitor C11, a pair of mutually-inverted diodes D11 and D12, and a resistor R15, all connected in parallel. A first side of the tank circuit defined by these elements is connected to the power supply through a resistor R11, while a second side of the circuit is connected to the power supply through a resistor R12. The first side of the circuit is connected to a collector of an NPN transistor Q11. The emitter of transistor Q11 is connected to ground through a series combination of resistor R13 and constant current source I11. The base of transistor Q11 is connected to the second side of the tank circuit through a forward-biased diode D13. Similarly, the collector of NPN transistor Q12 is connected to the second side of the tank circuit. The emitter of transistor Q12 is connected to ground through a series combination of resistor R14 and constant current source I12. The base of transistor Q12 is connected to the first side of the tank circuit through forward-biased diode D14. A resistor R16 connects the emitter of transistor Q11 with the emitter of transistor Q12.

The frequency modulator also comprises a phase adder circuit composed of transistors Q13, Q14, a series connection of a resistor R17 and a constant current source I13, a series connection of a resistor R18 and a constant current source I14, and a resistor R19. The collectors of the transistors Q13, Q14 are respectively connected to the bases of the transistors Q11, Q12 of the oscillator circuit, and the emitters of the transistors Q13, Q14 are respectively connected to the series connections. The resistor R19 couples the emitters of the transistors Q13, Q14. Thus, the transistors Q13, Q14 serving as amplification elements of the phase adder circuit, and the transistors Q11, Q12 serving as amplification elements of the oscillator circuit are connected in parallel with respect to a power source +Vcc, and the phase adder circuit is operated in a voltage driven mode.

Applied to the bases of the transistors Q13, Q14 are signals Vs, −Vs which are derived by phase-shifting the oscillation outputs (appearing at the cathodes of the diodes D13, D14) by phase shift circuit P10 and multiplying the phase-shifted signals by the modulating signal in multiplier M10 in a known fashion. As a result, the phases of the oscillation outputs of the oscillator circuit are varied and the desired frequency modulation is thus accomplished.

In operation, resistors R11 and R12 act as load resistors for connecting the bias voltage to the collectors of transistors Q11 and Q12, respectively. Resistor R15 is a load resistor connecting the collectors of the transistors Q11 and Q12 together. The tank circuit comprising inductor L11 and capacitor C11 sets the frequency of oscillation which is produced by the positive feedback established through diodes D13 and D14 between transistors Q11 and Q12. These diodes are used for level shifting the feedback signal. The resistor R19 controls the feedback current and diodes D11 and D12 control the maximum voltage swing between the collectors of transistors Q11 and Q12.

The oscillator itself operates in a conventional manner with the output of transistor Q11 taken at its collector being used to inversely drive the base of Q12, and vice versa so as to provide a closed loop gain of unity with zero phase shift. The frequency of oscillation is determined by the frequency of the tank circuit in a conventional manner and diodes D11 and D12 limit the output voltage swing.

Transistors Q13 and Q14 operate as voltage driven phase adders which increase or decrease the bias on the bases of transistors Q11 and Q12, respectively, thereby effecting the desired frequency modulation in response to an input signal comprising the modulating signal multiplied by a phase shifted oscillator output signal. Resistor R19 sets the feedback current of the phase adder circuit whereas resistors R13, R14, R17 and R18 prevent signal leakage. The current sources I11 through I14 set the entire circuit current level.

Figure 1:
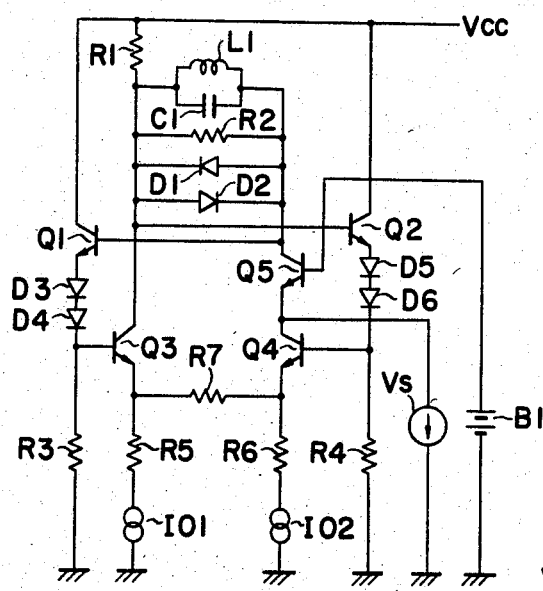
FIG. 1 is a circuit diagram illustrating one example of prior art frequency modulators.

It will be noted that the present invention of FIG. 2 differs from the prior art of FIG. 1 in that FIG. 1 includes a transistor Q5 which converts the feedback signal Vs to a current signal. This current signal is then used to control the oscillator phase and thus the frequency modulation. Otherwise, the circuit of FIG. 1 operates in a similar manner with resistors R1 and R2 being load resistors, the tank circuit L1, C1 being used to tune the frequency of the oscillator, transistors Q1, Q2 and diodes D3 through D6 being used for level shifting and feedback, and transistors Q3 and Q4 forming the basic oscillator amplifier. Resistor R7 sets the oscillation current and transistor Q5 forms the feedback current for frequency modulation. Resistors R5 and R6 prevent signal leakage and resistors R3, R4 as well as current sources I01 and I02 set the circuit current. Diodes D1, D2 limit the signal amplitude.

Figure 3:
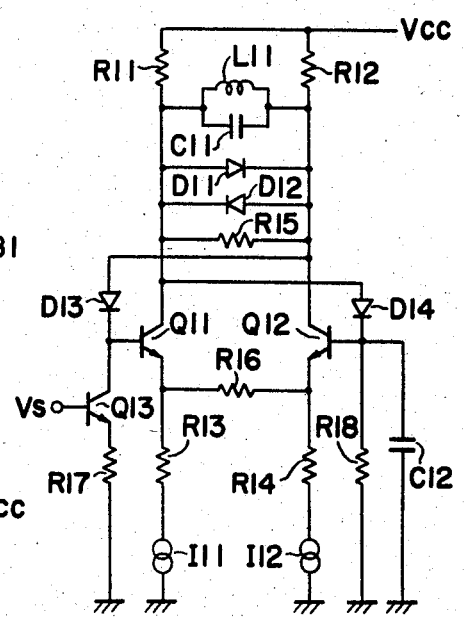
FIG. 3 is a circuit diagram showing another embodiment of the invention.

In the embodiment described above, the phase adder circuit has two transistors Q13, Q14. But as shown in FIG. 3, one (e.g., Q14) of them may be eliminated and the base of the transistor Q12 may be connected to a capacitor C12. Moreover, each of the diodes D13, D14 may be replaced by a series connection of a plurality of diodes, or by a resistor. In FIG. 3, similar components are provided with the same reference numerals as in FIG. 2. The similar components perform similar functions except that resistor R17 in FIG. 3 is used for setting feedback current and resistors R17 and R18 are used to set the overall circuit current in addition to current sources I11 and I12. Capacitor C12 in FIG. 3 provides an AC ground at the base of transistor Q12.

As has been described, according to the invention, the amplification elements (transistors Q13, Q14) of the phase adder circuit and the amplification elements (transistors Q11, Q12) of the oscillator circuit are connected in parallel with respect to the power source. As a result, a lower power source voltage will suffice for obtaining an expected circuit operation, and the signals Vs, −Vs applied to the phase adder circuit can be of a voltage driven type rather than a current driven type.

What is claimed is:

1. A frequency modulator comprising:
    an oscillator circuit including an oscillator amplification element and producing an oscillation output;
    phase shifting means, responsive to said oscillator circuit, for shifting the phase of said oscillation output by about 90° and thus for producing a phase-shifted signal;
    multiplying means, responsive to said phase shifting means, for multiplying said phase-shifted signal by a modulating signal to produce a product signal;
    a phase adder means, responsive to said multiplying means, and including a phase adder amplification element, for adding said product signal to said oscillation output and thus for varying the frequency of said oscillation output;
    said oscillator amplification element and said phase adder amplification element being connected in parallel with respect to a power source and in such a manner that the outputs of the amplification elements are combined.

2. A frequency modulator as set forth in claim 1, in which said amplification element of said oscillator circuit comprises a transistor connected to receive, at its base, the output of said phase adder circuit.

3. A frequency modulator as set forth in claim 2, in which said amplification element of said phase adder circuit comprises a transistor, whose collector is connected to the base of said transistor of said oscillator circuit.

* * * * *